United States Patent
Hayasaki

(10) Patent No.: US 9,048,835 B2
(45) Date of Patent: Jun. 2, 2015

(54) POWER SUPPLY AND IMAGE FORMING APPARATUS

(71) Applicant: Canon Kabushiki Kaisha, Tokyo (JP)

(72) Inventor: Minoru Hayasaki, Mishima (JP)

(73) Assignee: CANON KABUSHIKI KAISHA, Tokyo (JP)

(*) Notice: Subject to any disclaimer, the term of this patent is extended or adjusted under 35 U.S.C. 154(b) by 143 days.

(21) Appl. No.: 13/662,185

(22) Filed: Oct. 26, 2012

(65) Prior Publication Data

US 2013/0108304 A1 May 2, 2013

(30) Foreign Application Priority Data

Nov. 1, 2011 (JP) ................................. 2011-240585

(51) Int. Cl.
| | | |
|---|---|---|
| *G03G 15/00* | (2006.01) |
| *H02M 3/335* | (2006.01) |
| *H03K 17/30* | (2006.01) |
| *H02M 1/08* | (2006.01) |

(52) U.S. Cl.
CPC .......... *H03K 17/302* (2013.01); *Y02B 70/1475* (2013.01); *H02M 1/08* (2013.01); *H02M 3/33592* (2013.01); *H03K 2017/307* (2013.01)

(58) Field of Classification Search
CPC .. H02M 1/08; H02M 3/33592; H03K 17/302; H03K 2017/307; Y02B 70/1475
USPC .......................................... 399/88; 363/21.14
See application file for complete search history.

(56) References Cited

U.S. PATENT DOCUMENTS

| | | | | |
|---|---|---|---|---|
| 5,745,358 A * | 4/1998 | Faulk ................................ 363/95 |
| 5,745,359 A * | 4/1998 | Faulk ................................ 363/95 |
| 5,757,627 A * | 5/1998 | Faulk ........................... 363/21.14 |
| 5,764,495 A * | 6/1998 | Faulk ........................... 363/21.13 |
| 5,768,118 A * | 6/1998 | Faulk et al. ..................... 363/72 |
| 5,841,641 A * | 11/1998 | Faulk ........................... 363/21.14 |
| 7,773,399 B2 * | 8/2010 | Nakamura et al. ............ 363/127 |
| 2006/0171180 A1* | 8/2006 | Kyono .............................. 363/95 |
| 2007/0014133 A1* | 1/2007 | Shao et al. ...................... 363/52 |
| 2007/0103946 A1* | 5/2007 | Kyono ........................ 363/21.14 |
| 2007/0165429 A1* | 7/2007 | Selvaraju et al. ................ 363/53 |
| 2010/0232188 A1* | 9/2010 | Hayasaki ................... 363/21.15 |
| 2011/0038182 A1* | 2/2011 | Li et al. ...................... 363/21.06 |
| 2011/0122535 A1* | 5/2011 | Su ................................... 361/18 |

(Continued)

FOREIGN PATENT DOCUMENTS

| | | | |
|---|---|---|---|
| CN | 102104338 A | 6/2011 |
| JP | 7-007928 A | 1/1995 |
| JP | 2006-020444 A | 1/2006 |

(Continued)

*Primary Examiner* — David Bolduc
(74) *Attorney, Agent, or Firm* — Canon USA, Inc. IP Division

(57) ABSTRACT

In a power supply, a synchronous rectification switch rectifies a pulse voltage, and a current-voltage conversion unit converts a current on a voltage-input side of the synchronous rectification switch to a first voltage and converts a current on a voltage-output side of the synchronous rectification switch to a second voltage. A switching unit switches an operation state of the synchronous rectification switch based on a result of a comparison between the first voltage and the second voltage converted by the current-voltage conversion unit. A state holding unit holds an off state after the synchronous rectification switch is turned off by the switching unit.

12 Claims, 10 Drawing Sheets

(56) References Cited

U.S. PATENT DOCUMENTS

2011/0150521 A1* 6/2011 Uchiyama et al. .............. 399/88
2011/0150522 A1* 6/2011 Hayasaki et al. .............. 399/88

FOREIGN PATENT DOCUMENTS

| JP | 4126558 B | 7/2008 |
| JP | 4158054 B | 10/2008 |

* cited by examiner

POWER SUPPLY AND IMAGE FORMING APPARATUS

BACKGROUND OF THE INVENTION

1. Field of the Invention

The present invention relates to a switching power supply apparatus of a synchronous rectification type.

2. Description of the Related Art

An example of a switching power supply of a synchronous rectification type according to a related art is to configure a circuit using a comparator as illustrated in FIG. 6. For example, Japanese Patent Laid-Open No. 07-007928 discloses a circuit configured such that a comparator detects a voltage across a synchronous rectification FET and drives the synchronous rectification FET. In FIG. 6, 1001 denotes a transformer, 1002 denotes a DC power supply, 1003 denotes a primary-side MOSFET (hereafter, referred to as a primary-side FET), 1004 denotes a secondary-side electrolytic capacitor, 1005 denotes a load, 1006 denotes a switching control circuit, 1007 denotes a synchronous rectification FET, and 1008 denotes a comparator. When the primary-side FET 1003 turns on, energy is stored in the transformer. Thereafter, if the primary-side FET 1003 turns off, a source voltage of the synchronous rectification FET 1007 rises, and a "+" terminal voltage of the comparator 1008 becomes higher than a "−" terminal voltage. As a result, the synchronous rectification FET 1007 turns on, and a current starts to flow. Thereafter, when the current becomes 0 A and a current starts flowing reversely from the positive input terminal of the capacitor 1004 to the transformer 1001, the negative input terminal voltage of the synchronous rectification FET 1007 becomes higher than the "+" input terminal voltage, and the gate voltage of the synchronous rectification FET 1007 falls down. As a result, the synchronous rectification FET 1007 turns off. Thus, it is possible to control the synchronous rectification FET by the circuit including a small number of components configured in the above-described manner. In the circuit described above, the comparator may be replaced with a circuit including a PNP transistor and a NPN transistor as illustrated in FIG. 7. In the circuit illustrated in FIG. 7, the synchronous rectification FET is replaced with a PNP transistor.

Instead of directly detecting a current, a circuit may be configured based on an ET product of a transformer as disclosed, for example, in Japanese Patent No. 4126558 or Japanese Patent No. 4158054. FIG. 8 illustrates a circuit configuration disclosed in Japanese Patent No. 4126558. In FIG. 8, 1201 denotes a transformer, 1202 denotes a power supply, 1203 denotes a primary-side FET, 1204 denotes a synchronous rectification FET, 1205 denotes a secondary-side electrolytic capacitor, 1206 denotes a load, 1207 denotes a first constant current source, 1208 denotes a capacitor, 1209 denotes a second constant current source, 1210 denotes a reference voltage, 1211 denotes a comparator, and 1212 and 1213 respectively denote resistors. The constant current source 1207 is configured to generate a current proportional to a voltage of the transformer 1201 during a period in which the primary-side FET 1203 is in an on state. During the period in which the primary-side FET 1203 is in the on state, the voltage-time product in terms of the voltage appearing on the transformer 1201 is stored as a voltage across the capacitor. The second current source 1209 is configured to generate a current proportional to a voltage of the transformer 1201 during a period in which the primary-side FET 1203 is in an off state. When the primary-side FET 1203 turns off, the switch turns on and the voltage stored in the capacitor 1208 is discharged. When the voltage across the capacitor 1208 falls down to a value determined by the reference voltage 1210, the comparator 1211 operates. In response, a logic circuit inverts and the synchronous rectification FET 1204 turns off. FIG. 9 illustrates a circuit configuration disclosed in Japanese Patent No. 4158054, which is a simplified version of the circuit illustrated in FIG. 8. In this circuit configuration, the constant current sources are replaced with resistors such that the circuit operates in a similar manner to that disclosed in Japanese Patent No. 4126558.

Other known circuit configurations include a configuration in which a reference voltage source is connected in series to an input terminal of a comparator, a configuration in which a plurality of reference voltages serving as threshold values are disposed thereby to provide a hysteresis in characteristic, and a configuration in which a switchover of a current flowing from a current source is detected.

However, in the circuit configuration disclosed in Japanese Patent Laid-Open No. 07-007928, if the synchronous rectification FET has a small on-resistance and a drain-source voltage thereof is small, the circuit does not operate correctly.

In particular, when the switching power supply operates with a low load as in a critical mode or a discontinuous mode, the current flowing through the synchronous rectification FET on the secondary side of the transformer falls down to a value nearly equal to 0 A (ampere) and the drain-source voltage of the synchronous rectification FET becomes low. Therefore, if the synchronous rectification FET used has a low on-resistance, it is difficult to achieve a correct operation.

The above problem may be avoided by employing a synchronous rectification FET with a high on-resistance. However, such a synchronous rectification FET with a high on-resistance does not provide a high efficiency in the synchronous rectification operation. Besides, a synchronous rectification FET with a low on-resistance is low in cost, which provides an advantage that the circuit is produced at low cost. The recent tendency is to increase the operation efficiency of the power supply and reduce the cost by further reducing the on-resistance of the synchronous rectification FET. This means that the problem described above will become more serious.

On the other hand, in the circuit configurations disclosed in Japanese Patent No. 4126558 and Japanese Patent No. 4158054, the current is not directly detected and thus the operation reliability does not depend on the on-resistance of the synchronous rectification FET. Furthermore, because the circuit is based on the integral operation, the circuit is substantially free of operation errors and the circuit is simple in configuration. However, on the other hand, it is necessary to make setting and adjustment of the threshold value such that the synchronous rectification FET turns off when the current becomes 0 A. However, in a case where a large change occurs in output voltage which may occur, for example, in a short period immediately after the operation is started, or in a case where a large change occurs in load, the average time of charging and discharging the capacitor varies, and thus a shift occurs between the 0-current timing and the turning-off timing of the synchronous rectification FET.

This problem in the circuit configurations disclosed in Japanese Patent No. 4126558 and Japanese Patent No. 4158054 is caused by the fact that the operation of the synchronous rectification FET is controlled not based on the direct detection of the current but based on prediction and thus it is necessary for the operation timing to have a margin, i.e., it is necessary to turn off the synchronous rectification FET slightly earlier. That is, in the operation with such a margin, the synchronous rectification FET needs a longer period in which the body diode is in the on state, which results in a reduction in operation efficiency.

Furthermore, a forward voltage of the body diode appears during the on-period of the synchronous rectification FET. The forward voltage is much greater than the voltage detected when the current is 0 A. Therefore, in the circuit configuration in which the voltage across the synchronous rectification FET is detected using the comparator, the synchronous rectification FET is turned off before the current becomes 0 A, which may result in an operation error.

In view of the above, the present invention provides a switching power supply of a synchronous rectification type capable of operating correctly using a switching element with a low on-resistance without resulting in a reduction in efficiency.

SUMMARY OF THE INVENTION

In an aspect, the invention provides a power supply apparatus including a synchronous rectification switch configured to rectify an input pulse voltage, a current-voltage conversion unit configured to convert a current on a voltage-input side of the synchronous rectification switch to a first voltage and convert a current on a voltage-output side of the synchronous rectification switch to a second voltage, a switching unit configured to switch an operation state of the synchronous rectification switch based on a result of a comparison between the first voltage and the second voltage converted by the current-voltage conversion unit, and a state holding unit configured to hold an off state after the synchronous rectification switch is turned off by the switching unit.

In an aspect, the invention provides an image forming apparatus including an image forming unit configured to form an image on a recording material, a control unit configured to control an operation of the image forming unit, and a power supply configured to supply a DC voltage to the control unit, the power supply including a synchronous rectification switch configured to rectify an input pulse voltage, a current-voltage conversion unit configured to convert a current on a voltage-input side of the synchronous rectification switch to a first voltage and convert a current on a voltage-output side of the synchronous rectification switch to a second voltage, a switching unit configured to switch an operation state of the synchronous rectification switch based on a result of a comparison between the first voltage and the second voltage converted by the current-voltage conversion unit, and a state holding unit configured to hold an off state after the synchronous rectification switch is turned off by the switching unit.

Further features of the present invention will become apparent from the following description of exemplary embodiments with reference to the attached drawings.

DESCRIPTION OF THE EMBODIMENTS

Configurations and operations of embodiments are described below. Note that the embodiments are described below by way of example but not limitation, i.e., the present invention is not limited to the details of the embodiments.

The present invention is described in detail below with reference to embodiments in conjunction with accompanying drawings.

A first embodiment is described below.

Figure 1:
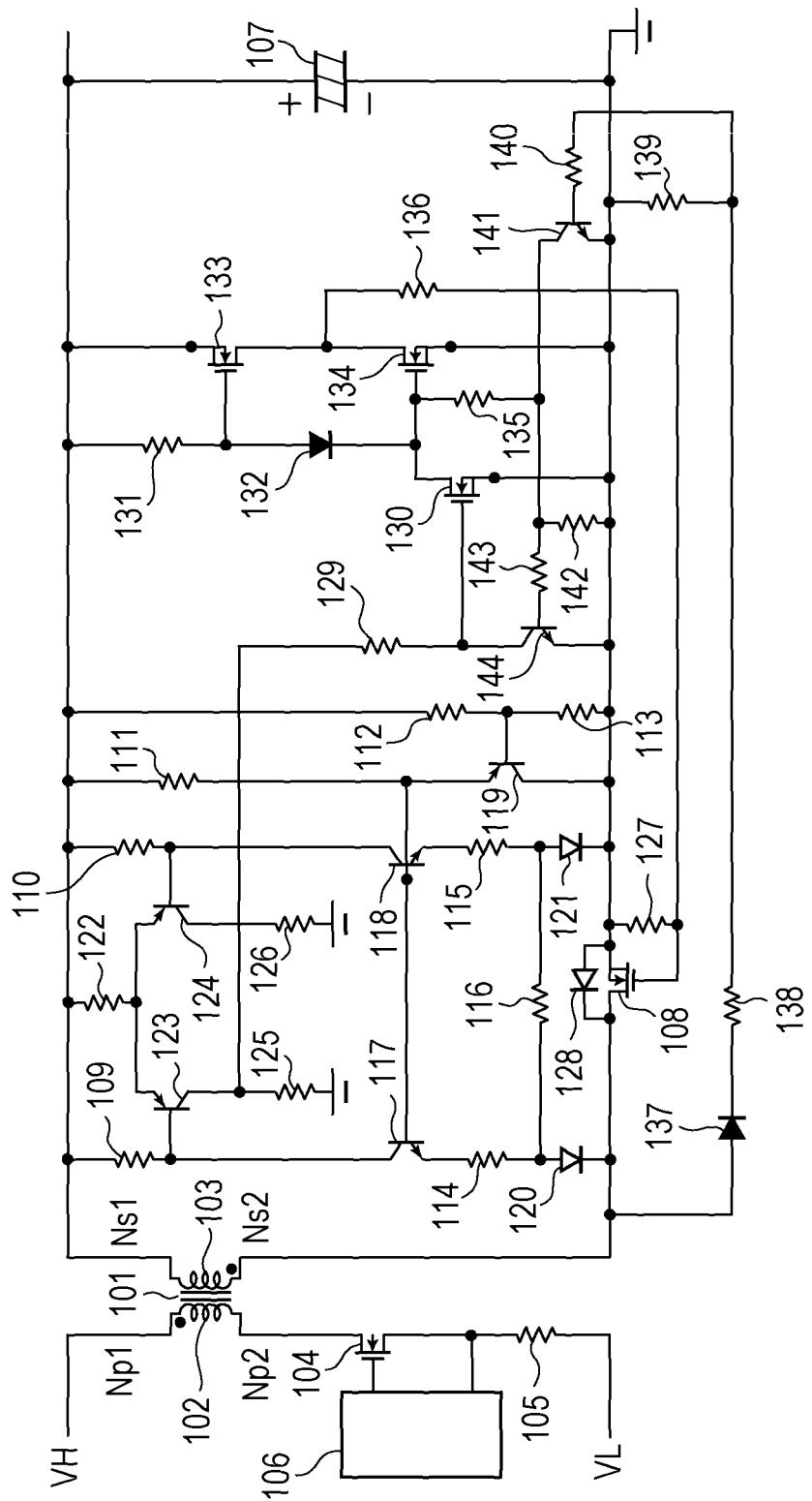
FIG. 1 is a circuit diagram of a switching power supply of a synchronous rectification type according to a first embodiment.

FIG. 1 illustrates a circuit configuration of a switching power supply according to the first embodiment. In FIG. 1, 101 denotes a transformer, 102 denotes a primary winding of the transformer, 103 denotes a secondary winding of the transformer, 104 denotes a switching element (for example, a MOSFET) disposed on a primary side of the transformer 101, 105 denotes a current detection resistor, 106 denotes a power supply control IC (Integrated Circuit), 107 denotes an electrolytic capacitor disposed on a secondary side of the transformer 101, and 108 denotes a synchronous rectification FET functioning as a synchronous rectification switch. In the present example, an N-channel type FET is used as the synchronous rectification FET. A source terminal of the synchronous rectification FET 108 is connected to a "−" terminal of the secondary-side electrolytic capacitor 107, and a drain terminal is connected to the secondary winding 103. Note that 109, 110, 111, 112, 113, 114, 115, 116, 122, 125, 126, 127, 129, 131, and 138 respectively denote resistors, 117 and 118 denote NPN transistors, and 119 denotes a PNP transistor. Furthermore, 120, 121, 132, and 137 respectively denote diodes. A body diode 128 is a diode which may be formed integrally with the synchronous rectification FET 108 or may be disposed separately from the synchronous rectification FET 108. In the circuit of the present example, a pulse voltage generated across the secondary winding of the transformer is rectified by the synchronous rectification FET 108 and further smoothed, and a resultant rectified and smoothed voltage is output as a DC voltage.

Figure 2:
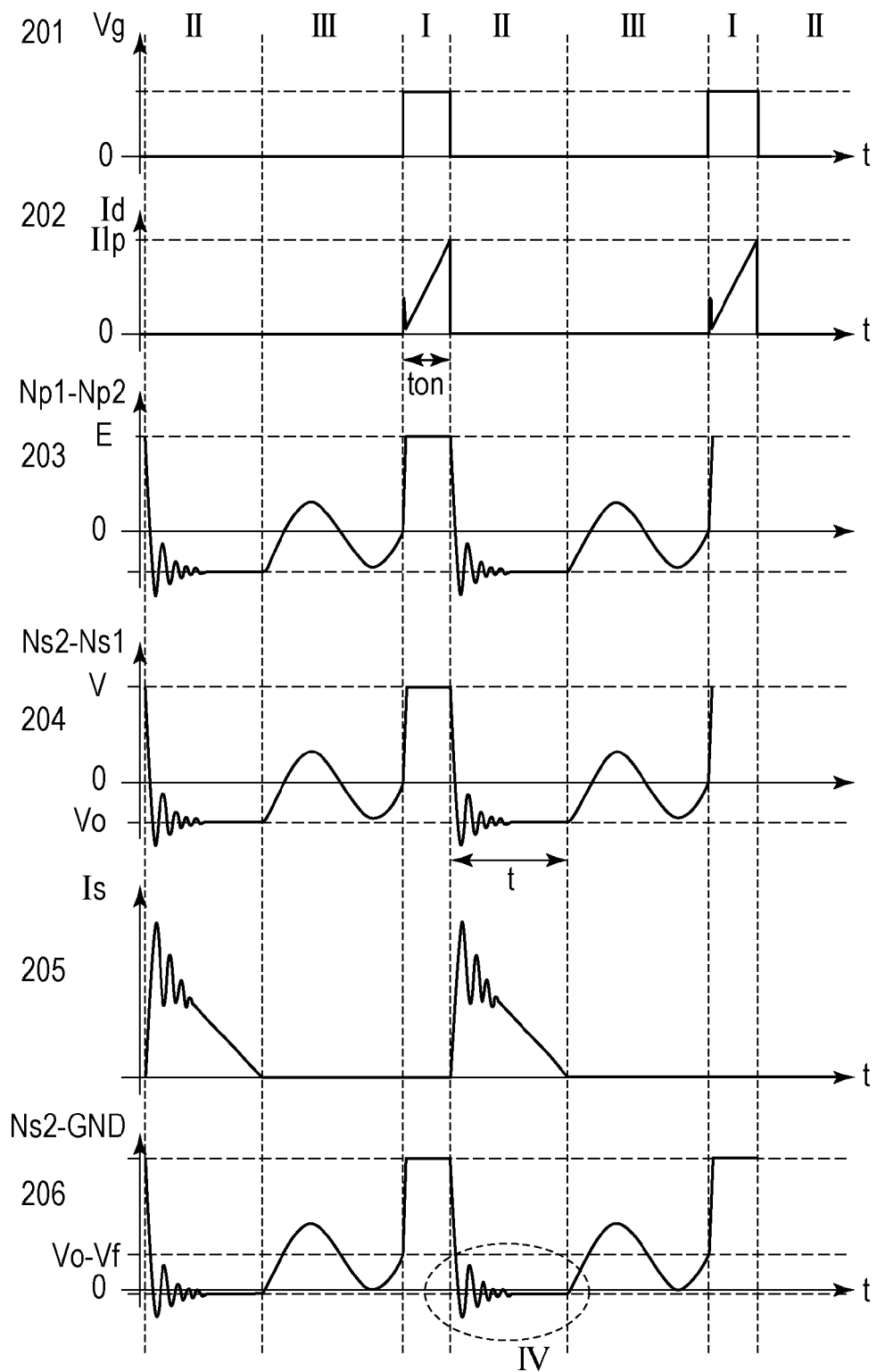
FIG. 2 is a diagram illustrating operating waveforms of the switching power supply of the synchronous rectification type according to the first embodiment.

FIG. 2 illustrates operating waveforms of various parts that appear during an operation of the switching power supply. When the primary-side FET 104 turns on and a voltage is applied to the primary winding 102, a current starts flowing in a direction from the primary winding 102 of the transformer 101 to the drain and further to the source of the primary-side FET 104. In FIG. 2, a waveform 201 denotes a voltage waveform between the gate and the source of the primary-side FET 104, and a waveform 202 denotes a drain current Id of the primary-side FET 104. The primary-side FET 104 is in the on state during a period I. In this state, a voltage is applied across the primary winding 102 of the transformer 101 such that a terminal Np1 of the primary winding 102 has a higher potential than the other terminal Np2 as represented by a waveform 203 in FIG. 2. The waveform 203 in FIG. 2 represents the voltage that appears across the primary winding 102 of the transformer 101, i.e., the voltage between Np1 and Np2. In response, a voltage is generated across the secondary winding 103 such that a terminal Ns2 has a higher potential than a terminal Ns1. The potential difference (the voltage across the secondary winding 103) of the waveform 204 in FIG. 2 is given as potential difference=E×n2/n1 where n1 denotes the number of turns of the primary winding and n2 denotes the number of turns of the secondary winding.

During this period I, the body diode (or Schottky diode)128 of the synchronous rectification FET 108 prevents a current from flowing through the secondary-side electrolytic capacitor 107. In FIG. 2, a waveform 205 denotes a current flowing through the secondary winding 103. The current flowing through the primary winding 102 of the transformer 101 increases with time during the period in which the primary-side FET 104 is in the on state. The current Ilp of the primary winding 102 is given by Ilp=E×ton/Lp where Lp denotes the inductance of the primary winding 102 and ton (illustrated in FIG. 2) denotes the time elapsed since the turning-on of the primary-side FET 104. As a result, energy of $\frac{1}{2} \times Lp \times Ilp^2$ is stored in the transformer 101.

When ton has elapsed, the primary-side FET 104 turns off, which causes the energy stored in the transformer 101 to be released from the secondary winding 103 (the voltage across the secondary winding 103 is represented by the waveform 204 in FIG. 2). A period II in FIG. 2 is a period in which the primary-side FET 104 turns off and the energy of the transformer 101 is released to the second side of the transformer 101. During this period II, a voltage appears across the secondary winding 103 such that the polarity thereof is opposite to that of the voltage that appears when the primary-side FET 104 is in the on state. That is, the voltage is higher at the terminal Ns1 than at the terminal Ns2. As a result, the body diode (or Schottky diode) 128 of the synchronous rectification FET 108 turns on.

The secondary-side electrolytic capacitor 107 is charged by a current flowing through a path starting from the terminal Ns1 of the secondary winding 103 of the transformer 101 and passing through the "+" terminal and the "−" terminal of the secondary-side electrolytic capacitor 107, and the source and the drain of the synchronous rectification FET 108, and returning to the terminal Ns2 of the secondary winding 103. The current Is flowing through the path on the second side decreases as the energy stored in the transformer 101 is released until the current Is becomes equal to 0 A when all energy stored in the transformer 101 has been released (period III). Let t (illustrated in FIG. 2) denote a time at which the current flowing through the path on the secondary side of the transformer becomes 0 A, Ilp denote the value of the current immediately before the primary-side FET 104 turns off, Ls denote the inductance of the secondary winding, and Vo denote the voltage on the secondary side of the transformer, then Vo×t=Is×Ls where Is=n1/n0×Ilp.

The current flowing through the secondary winding 103 and the synchronous rectification FET 108 becomes 0 A when time t has elapsed. Thereafter, if the synchronous rectification FET 108 further remains in the on state, then a current flows through a path starting from the "+" terminal of the secondary-side electrolytic capacitor 107 and passing through the terminal Ns1 and the terminal Ns2 of the secondary winding 103, the drain and source of the synchronous rectification FET 108, and returning to the "−" terminal of the secondary-side electrolytic capacitor 107.

As a result, the voltage of the secondary-side electrolytic capacitor 107 is applied to the secondary winding 103, and the voltage across the primary winding Np also functions to maintain a flyback voltage. That is, when the voltage across the secondary-side electrolytic capacitor 107 is denoted by Vo, the voltage appearing across the primary winding 102 is given by Vo×n0/n1. Thus, the voltage between the drain and the source of the primary-side FET 104 is given by E+V0×n0/n1.

Figure 3:
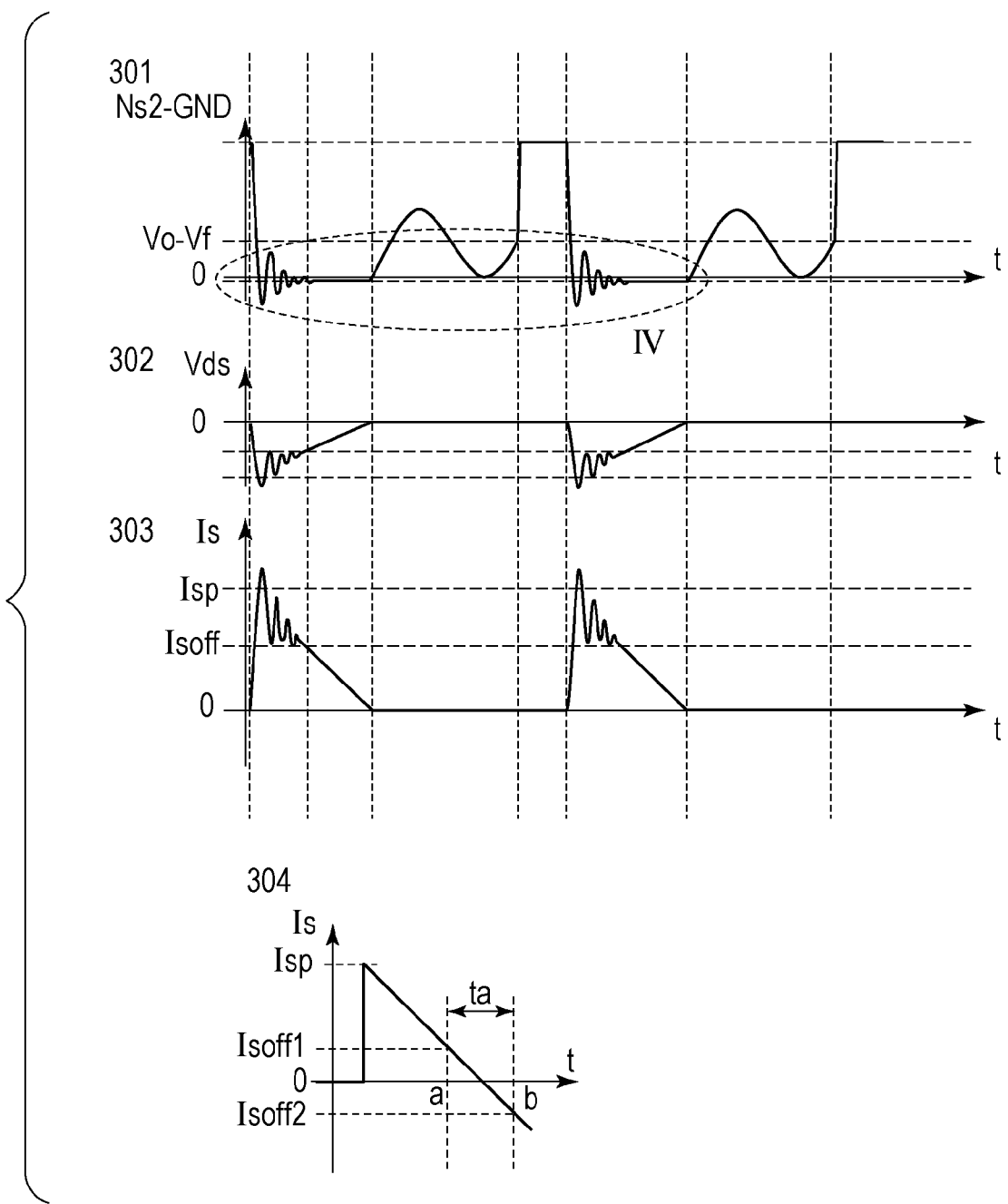
FIG. 3 is a diagram illustrating operating waveforms of the switching power supply of the synchronous rectification type according to the first embodiment.

In the period in which the primary-side FET 104 is in the on state and the synchronous rectification FET 108 is in the off state, the drain voltage of the synchronous rectification FET 108 is high and the source voltage is low. When the primary-side FET 104 turns off and a voltage and a current are generated in the secondary winding 103 in a direction which causes the secondary-side electrolytic capacitor 107 to be charged, the body diode 128 of the synchronous rectification FET 108 turns on. In this state, the voltage applied to the synchronous rectification FET 108 is equal to the voltage at the terminal Ns2 of the secondary winding 103 of the transformer denoted by the waveform 206 in FIG. 2. The details of the waveform 206 in the period IV are illustrated in FIG. 3. The waveform 206 in FIG. 2 corresponds to a waveform 301 in FIG. 3.

A cathode terminal of the diode 121 and a cathode terminal of the diode 120 are respectively connected to the source and the drain of the synchronous rectification FET 108. Therefore, when a current flows through the synchronous rectification FET 108, a voltage drop across the synchronous rectification FET 108 brings about a change in cathode voltages. The diode 120 is connected to a constant current source including a resistor 114 and a transistor 117, and the diode 121 is connected to a constant current source including a resistor 115 and a transistor 118. The two constant current source circuits provide currents determined by a constant voltage source circuit including resistors 111, 112, and 113 and a transistor 119 and cathode voltages of the respective diodes 120 and 121. The respective currents are converted into voltages by respective resistors 110 and 109. The resistor 109 functions as a current-voltage conversion circuit that converts a current on a pulse-voltage-input side of the synchronous rectification FET 108 to a first voltage, and the resistor 110 functions as a current-voltage conversion circuit that converts a current on a pulse-voltage-output side of the synchronous rectification FET 108 to a second voltage. The first voltage is supplied from the resistor 109 to a transistor 123, and the second voltage is supplied from the resistor 110 to a transistor 124. The transistors 123 and 124 form a comparator that compares the voltages supplied from the resistor 109 and the resistor 110.

The voltage across the synchronous rectification FET 108 provides a forward voltage (Vf) of the body diode 128, and the synchronous rectification FET 108 turns on in response to an operation of the comparator including the transistors 123 and 124. When the synchronous rectification FET 108 turns on and the drain-source voltage thereof becomes equal to the on-resistance×Is, the voltage between the drain and the source is as represented by a voltage waveform 302 in FIG. 3. In this state, a current flows through the synchronous rectification FET 108 as represented by a current waveform 303. The polarity of the waveform 303 is defined such that the current is positive when the current flows in a direction from the source to the drain of the synchronous rectification FET 108. As can be seen from the waveform 303, the current Is approaches 0 A with time. As a result, the drain-source voltage of the synchronous rectification FET 108 approaches 0 V.

For example, when the on-resistance of the synchronous rectification FET 108 is 10 mΩ and the current at a certain time is 1.0 A, the voltage across the synchronous rectification FET 108 at this certain time is 10 mV which is close to an offset voltage of the comparator. In a case where the comparator operates outside a range (offset voltage) of ±10 mV, the synchronous rectification FET 108 turns off in a period in which the current value is in a range of Isoff1 to Isoff2 as represented by a waveform 304 in FIG. 3. That is, the synchronous rectification FET 108 turns off in a period to of the waveform 304 in FIG. 3. In a case where the comparator operates with a current of Isoff1 at time an in the waveform 304, the body diode 128 of the synchronous rectification FET 108 turns on at a time after time a.

In response, the voltage across the synchronous rectification FET 108 increases until it becomes equal to the forward voltage of the body diode 128. As a result, the input voltage of the comparator increases up to a voltage close to the previous value the comparator had when the synchronous rectification FET 108 turned on. That is, the cathode voltage of the diode 121 becomes lower by about 1 V than the cathode voltage of the diode 120. In this state, the current flowing through the resistor 114 becomes greater than the current flowing through the resistor 115, and the voltage across the resistor 109 becomes smaller than the voltage across the resistor 110. As a result, the base voltage of the transistor 123 becomes lower than the base voltage of the transistor 124, and the gate voltage of the FET 130 rises, and thus the FET 130 turns on, the FET 133 turns on, and the FET 134 turns off. Thus, the synchronous rectification FET 108 turns on. This causes the voltage across the synchronous rectification FET 108 to again fall, and the comparator turns off the synchronous rectification FET 108. The above-described operation is repeated, and thus the synchronous rectification FET 108 does not operate in a correct manner.

To prevent the incorrect operation, in the present embodiment, additional resistors 135, 142, and 143 and an additional transistor 144 are provided to form, together with the FET 130, a state holding circuit.

If the FET 130 turns off, then the FETs 133 and 134 turn on and thus the synchronous rectification FET 108 turns on. In this operation, the turning-off of the FET 130 causes the transistor 144 to turn on. The collector of the transistor 144 is connected to the gate terminal of the FET 130 so that when the FET 130 once turns off, the resultant state is maintained. This makes it possible to maintain the off state once the FET 130 turns off, and thus it becomes possible to prevent the synchronous rectification FET 108 from turning on again even when the voltage across the synchronous rectification FET 108 increases to a value equal to the forward voltage of the body diode 128 in response to turning-off of the synchronous rectification FET 108.

In this embodiment, the base terminal of the transistor 144 is connected to the collector terminal of the transistor 141 such that the transistor 141 turns on in response to rising of the voltage at the terminal Ns2 of the secondary winding 103 of the transformer 101. The synchronous rectification FET 108 needs to turn on when the voltage at the terminal Ns2 of the secondary winding 103 of the transformer 101 falls down after the above-described rising. To satisfy the above requirement, the transistor 144 is turned off when the voltage at the terminal Ns2 rises up thereby releasing the synchronous rectification FET 108 from being held in the off state.

That is, a switching circuit is provided to switch a mode in which the synchronous rectification FET 108 is maintained in the off state by the state holding circuit and a mode in which the synchronous rectification FET 108 is turned on in response to an increase in voltage at the terminal Ns2 of the secondary winding 103 of the transformer. That is, the switching circuit is configured to reset the state holding circuit in response to turning-on of the primary-side FET 104 and to turn on the synchronous rectification FET 108 immediately after the primary-side FET 104 turns off.

In the present embodiment, a difference in base-emitter voltage (Vbe) between the transistors 117 and 118 and a difference in forward voltage between the diodes 120 and 121 may affect current detection accuracy, and thus the transistors 117 and 118 are to be highly similar in characteristics to each other and the diodes 120 and 121 are to be highly similar in characteristics to each other. By producing the transistors and the diodes on a single integrated circuit chip, it is possible to reduce the differences described above to negligible small levels.

In the present embodiment, as described above, it is possible to correctly drive the synchronous rectification FET with no operation errors even when the synchronous rectification FET has a low on-resistance.

A second embodiment is described below.

Figure 4:
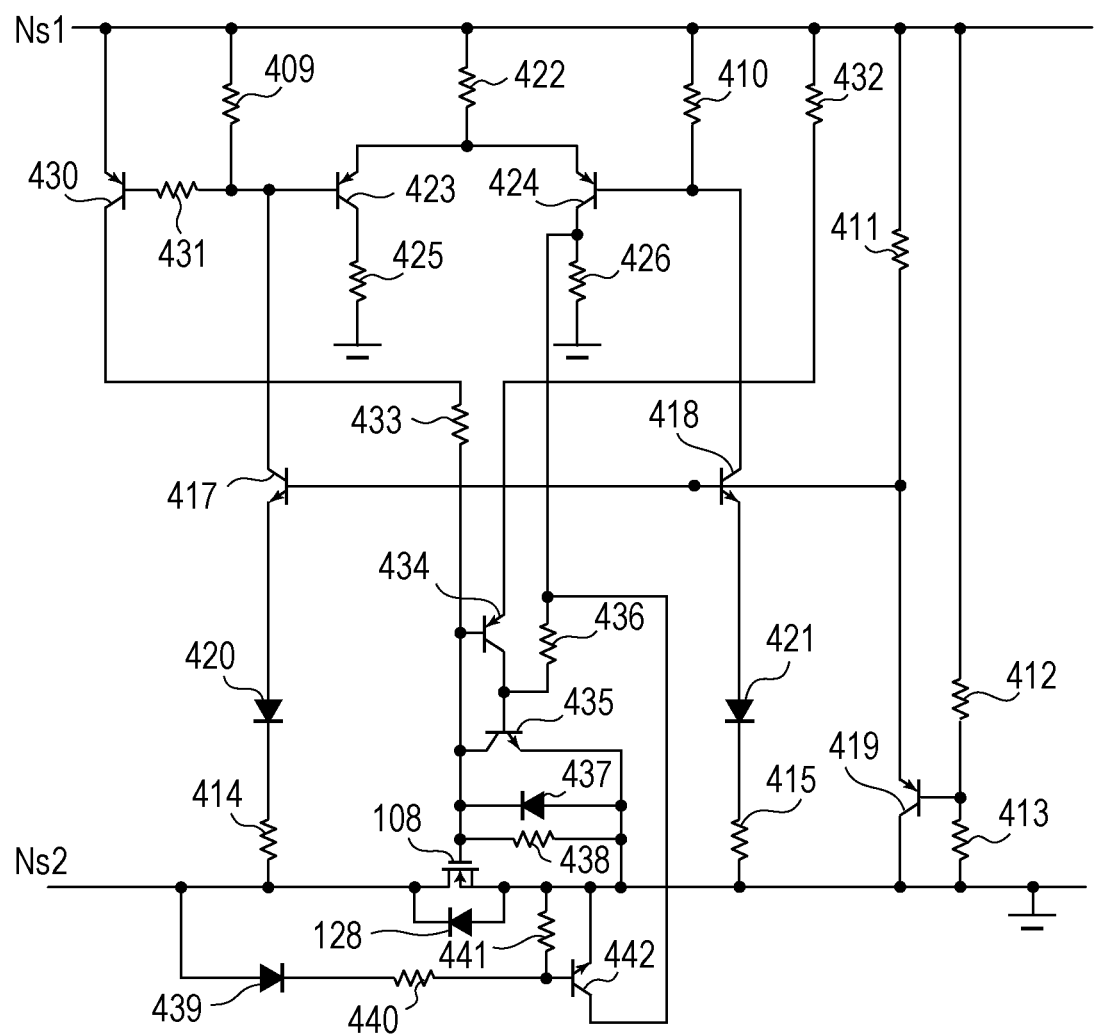
FIG. 4 is a circuit diagram of a switching power supply of a synchronous rectification type according to a second embodiment.

FIG. 4 illustrates a circuit configuration according to the second embodiment. The following explanation focuses on differences from the first embodiment, and a description of similar parts to those according to the first embodiment is omitted (i.e., a description is not given as to a comparator, a circuit for switching the on/off state of the synchronous rectification FET, and other circuits similar to those according to the first embodiment).

The circuit illustrated in FIG. 4 includes a synchronous rectification FET 108 and a control circuit configured to control the operation of the synchronous rectification FET 108. Note that a current detection unit is configured in a similar manner to that according to the first embodiment. That is, a constant current source circuit is configured using a transistor 417, a resistor 414, and a backflow prevention diode 420 in which the collector of the transistor 417 is connected to a resistor 409. A similar constant current source circuit is provided which includes a transistor 418, a resistor 415, and a diode 421 connected such that the resistor 415 and the diode 421 are connected in series to the emitter of the transistor 418 wherein the resistor 415 is connected between the ground and the cathode of the diode 421. The collector of the transistor 418 is connected to a resistor 410. The bases of the transistors 417 and 418 are connected together to the emitter of a transistor 419 such that a constant voltage is provided to the bases of the transistors 417 and 418. The collector of the transistor 419 is grounded, and the base of the transistor 419 is supplied with a bias voltage given by dividing the power supply voltage with resistors 412 and 413.

In FIG. 4, when the synchronous rectification FET 108 is in the off state, if the voltage at the terminal Ns2 of the secondary winding 103 of the transformer rises, a voltage divided by a diode 439, a resistor 440, and a resistor 441 is applied to a base terminal of a transistor 442. As a result, the transistor 442 turns on. This causes a base voltage of a transistor 435 to fall down via a resistor 436, which makes it impossible for the transistor 435 to turn on. In this state, because the synchronous rectification FET 108 in the off state and the body diode (or external Schottky diode) 428 is reversely biased, the synchronous rectification FET 108 does not turn on. When the primary-side FET 104 (illustrated in FIG. 1) turns off, the voltage at the terminal Ns2 of the secondary winding 103 falls down below the ground voltage. When this voltage becomes lower than the forward voltage of the body diode (or Schottky diode) 428 of the synchronous rectification FET 108, the body diode 428 turns on and a current flows therethrough.

Furthermore, the diode 420 also turns on and a current flows through the resistor 414. Because the transistor 417 is in the common-base configuration, when an increase occurs in current flowing through the resistor 414, a quick response occurs such that a substantially equal current flows through the resistor 409. This change in current flowing through the resistor 409 causes the transistor 430 to turn on via the resistor 431, and thus the synchronous rectification FET 108 immediately turns on.

As a result of the turning-on of the synchronous rectification FET 108, the current stored in the transformer is released, and thus the drain current of the synchronous rectification FET 108 decreases linearly toward 0 A. In response, a comparator including transistors 423 and 424 operates and thus the transistor 435 is turned on.

As a result, the base voltage of the transistor 434 falls down, which causes the transistor 434 to turn on which in turn causes a base current to flow so as to turn on the transistor 435. Thus, the transistor 435 remains in the on state regardless of the input from the comparator.

Once the synchronous rectification FET 108 turns off in the above-described manner, the synchronous rectification FET 108 remains in the off state unless a next operation occurs in the primary-side FET 104. In other words, the synchronous rectification FET 108 remains in the off state until the synchronous rectification FET 108 is released from the off state by the operation of the primary-side FET 104.

In the present embodiment, as described above, it is possible to correctly drive the synchronous rectification FET with no operation errors even when the synchronous rectification FET has a low on-resistance. Furthermore, because the holding of the state is reset in the on period of the primary-side FET 104, the synchronous rectification FET turns on quickly in response to turning-off of the main FET.

A third embodiment is described below.

Figure 5:
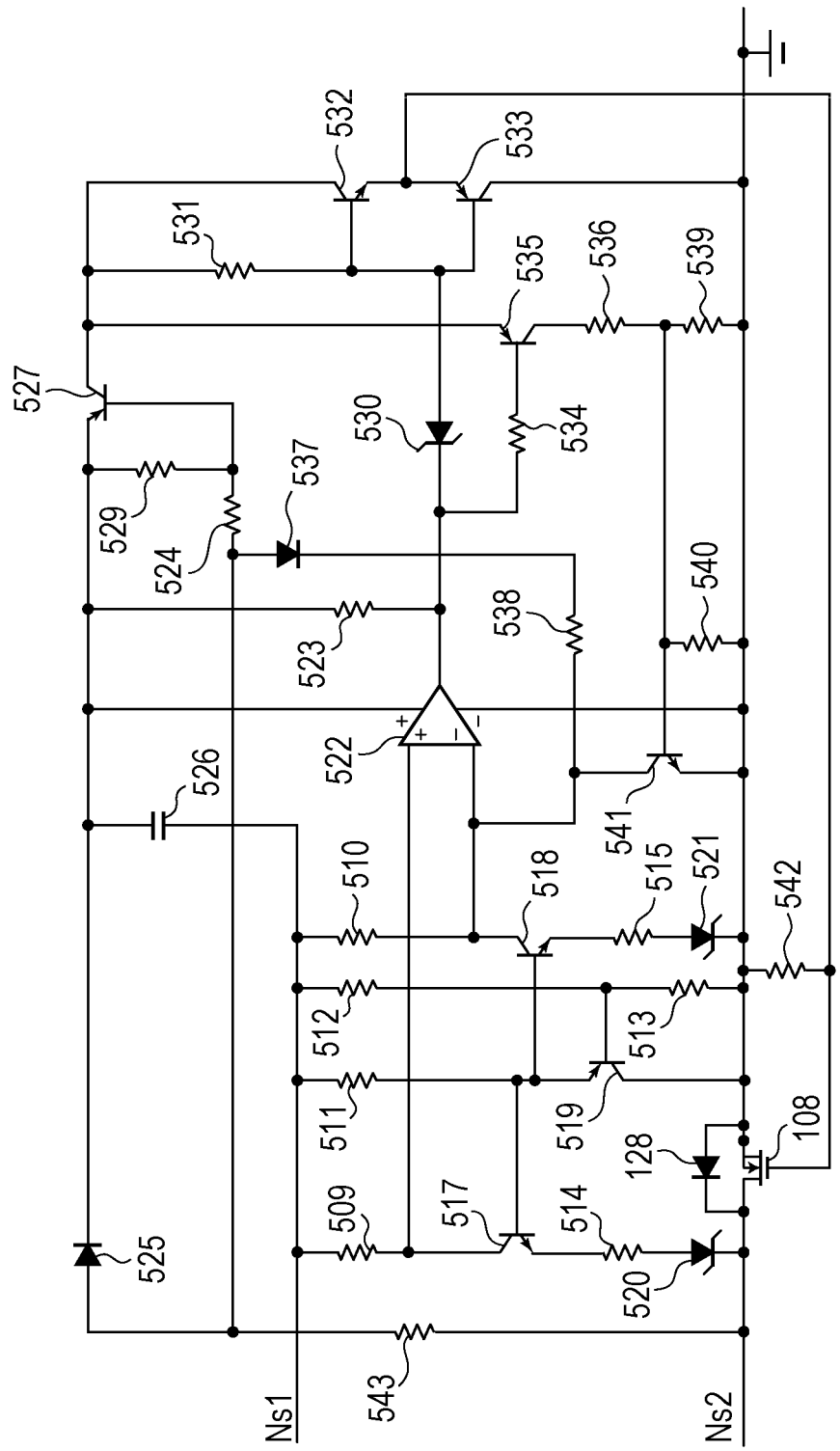
FIG. 5 is a circuit diagram of a switching power supply of a synchronous rectification type according to a third embodiment.
Figure 6:
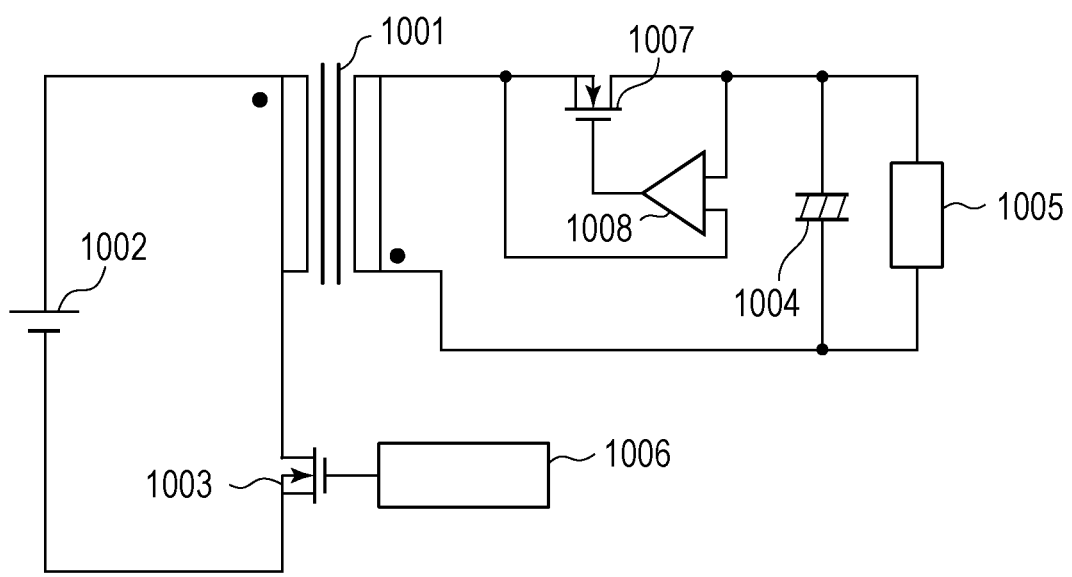
FIG. 6 is a diagram illustrating a configuration of a switching power supply of a synchronous rectification type according to a related technique.
Figure 7:
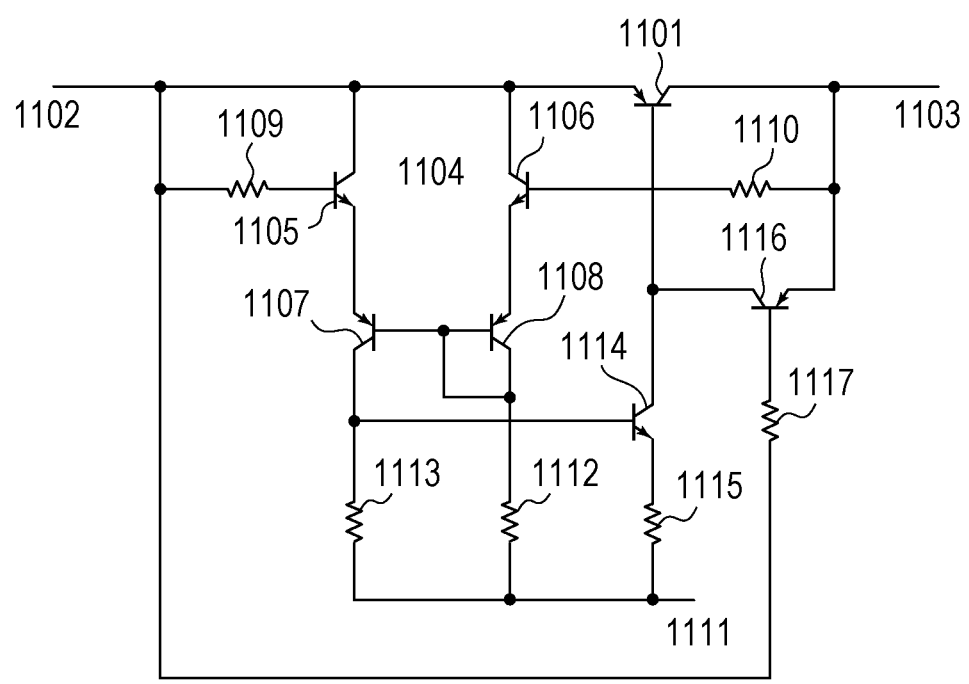
FIG. 7 is a circuit diagram of a switching power supply of a synchronous rectification type according to a related technique.
Figure 8:
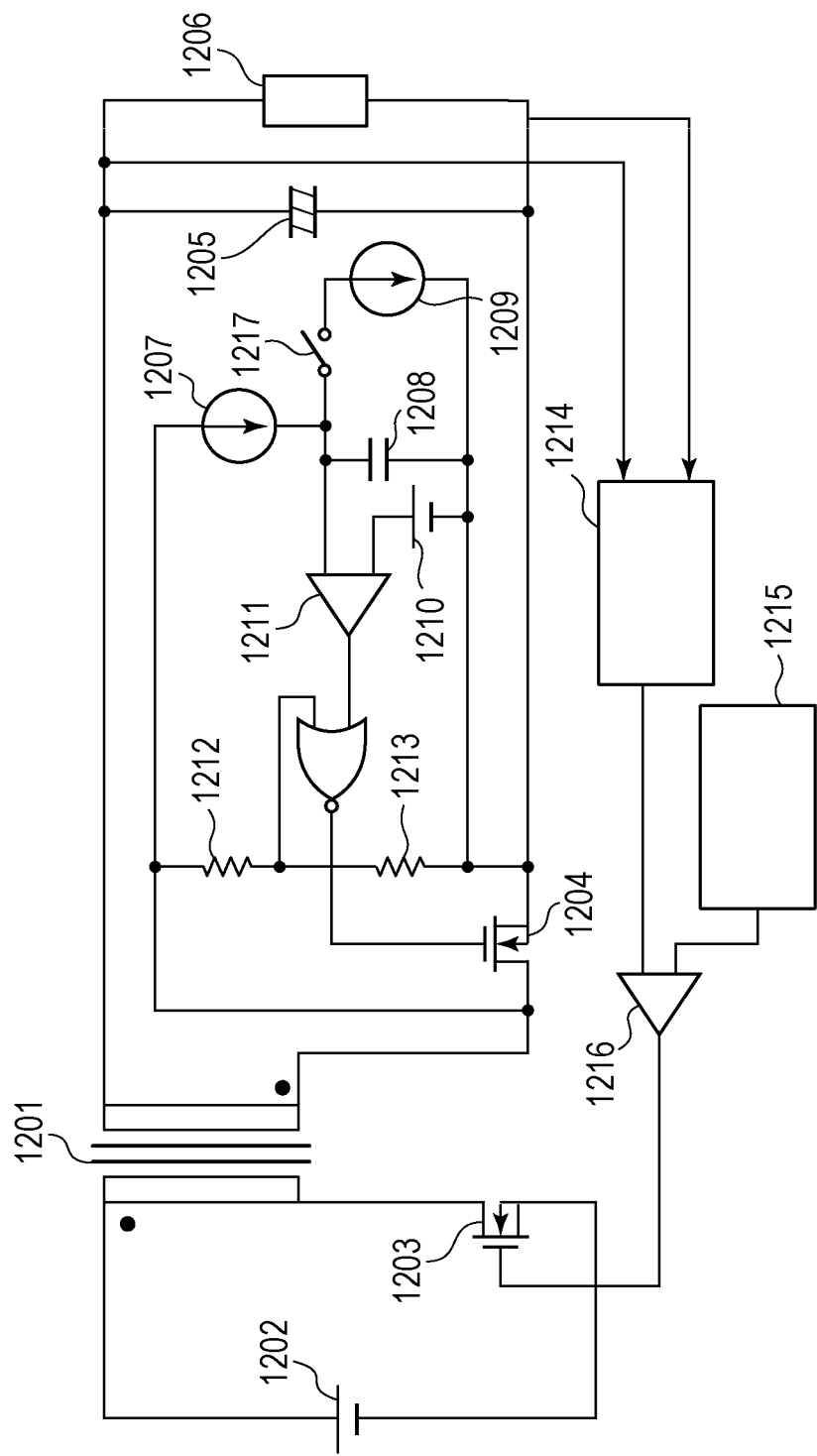
FIG. 8 is a diagram illustrating a configuration of a switching power supply of a synchronous rectification type according to a related technique.
Figure 9:
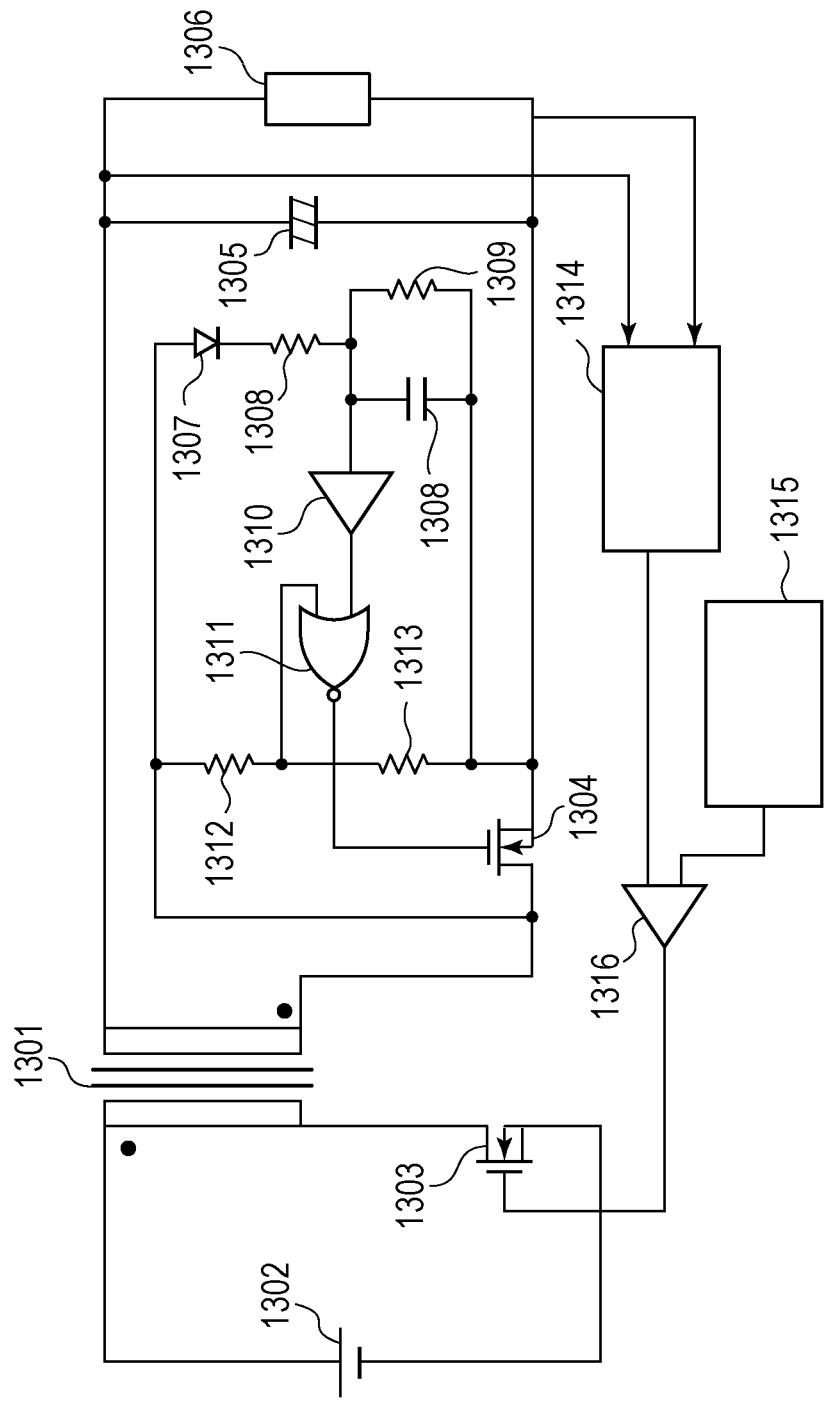
FIG. 9 is a diagram illustrating a configuration of a switching power supply of a synchronous rectification type according to a related technique.

FIG. 5 illustrates a circuit configuration according to the third embodiment. The following explanation focuses on differences from the first embodiment, and a description of similar parts to those according to the first embodiment is omitted (i.e., a description is not given as to a comparator, a circuit for switching the on/off state of the synchronous rectification FET, and other circuits similar to those according to the first embodiment).

In FIG. 5, a comparator 522 is provided to compare a voltage of a resistor 509 and a voltage of a resistor 510. The power supply voltage for the comparator 522 is supplied by charging a capacitor 526 through a diode 525 with a voltage that appears at the terminal Ns2 of the secondary winding 103 when the primary-side FET 104 (illustrated in FIG. 1). When the primary-side FET 104 turns on, a voltage higher than the voltage at the ground terminal occurs at the terminal Ns2 of the secondary winding 103, and the voltage is rectified by the diode 525 thereby charging the capacitor 526. In this operation, a transistor 527 turns off, and the synchronous rectification FET 108, the body diode 128, and the Zener diode 520 are in the off state. In this state, the voltage of the "+" input terminal of the comparator 522 is higher than the voltage of the "−" input terminal because of a current flowing through a diode 537 and a resistor 538, and the output of the comparator is in an open state. However, because the transistor 527 is in the off state, no electric power is supplied to the transistors 532 and 533 and thus the synchronous rectification FET 108 remains in the off state. When the primary-side FET 104 turns off, the voltage generated at the terminal Ns2 of the secondary winding 103, i.e., the drain voltage of the synchronous rectification FET 108 becomes lower than the voltage of the ground terminal. As a result, a current flows through a resistor 524 and the base voltage of the transistor 527 falls down, and the transistors 532 and 533 turn off. Thus, the synchronous rectification FET 108 turns on. A voltage lower than the ground terminal voltage by a value equal to the forward voltage of the body diode 128 is applied to the drain terminal of the synchronous rectification FET 108 until the synchronous rectification FET 108 turns on. During this period, a bias current flows to a transistor 517 via the Zener diode 520 and the resistor 514. This results in a reduction in the "−" terminal voltage of the comparator 522 connected to the resistor 509, and thus the output terminal of the comparator 522 remains in the open state and the synchronous rectification FET 108 remains in the on state. When the synchronous rectification FET 108 is in the on state, the voltage across the synchronous rectification FET 108 is equal to the product of the on-resistance thereof and the drain current, and thus the drain voltage of the synchronous rectification FET 108 is kept lower than the ground terminal voltage although the voltage across the synchronous rectification FET 108 falls down. A change in voltage across the synchronous rectification FET 108 is magnified several times by an amplification function provided by a combination of a constant current source circuit including the resistor 514 and the transistor 517 and the resistor 509 connected to the collector of the transistor 517, and the resultant amplified voltage is input to the comparator 522. Thus, the comparator 522 turns on when the drain-source voltage of the synchronous rectification FET 108 is nearly equal to 0 V. If the comparator 522 turns on, then the diode 530 turns on which results in a reduction in the base voltage of the transistor 532 and that of the transistor 533. As a result, the transistor 532 turns off and the transistor 533 turns on. Thus, the synchronous rectification FET 108 turns off. At the same time, the transistor 535 is turned on and the transistor 541 is turned on. This causes the "+" terminal of the comparator 522 to go down to a low level. As a result, the output of the comparator 522 is latched at the low level. In this operation period, the transistor 527 is still in the on state, and the output of the transistor 527 functions as a power supply voltage of the state holding circuit whereby the state holding circuit continues to operate without releasing the holding of the state until the primary-side FET turns on again. By employing the configuration described above, it becomes possible to achieve a high-reliability synchronous rectification operation with no operation errors.

In the circuit according to the present embodiment, the "−" terminal of the capacitor 526 is connected to the terminal Ns1 of the secondary winding. Alternatively, in a case where the amount of discharging from the secondary-side electrolytic capacitor 107 is small, the "−" terminal of the capacitor 526 may be connected to the ground terminal.

In the present embodiment, as described above, it is possible to correctly drive the synchronous rectification FET with no operation errors even when the synchronous rectification FET has a low on-resistance. Furthermore, because electric power for driving the synchronous rectification FET is supplied in a dedicated manner from the secondary winding such that the voltage for driving the synchronous rectification FET is maintained sufficiently high even when the output voltage of the power supply is low. In this circuit configuration, it is allowed to employ a general-purpose FET with a low on-resistance.

Applications of the switching power supply are described below.

The switching power supply according to one of the embodiments described below may be used, for example, as a low voltage power supply for supplying electric power to a motor serving as a driving part of an apparatus or a controller (including a CPU, a memory, etc.) serving as a control unit of an apparatus. Such a low voltage power supply may be used, for example, as a power supply in an image forming apparatus configured to form an image on a recording material. An example of a low voltage power supply used in an image forming apparatus is described below.

Figure 10A:
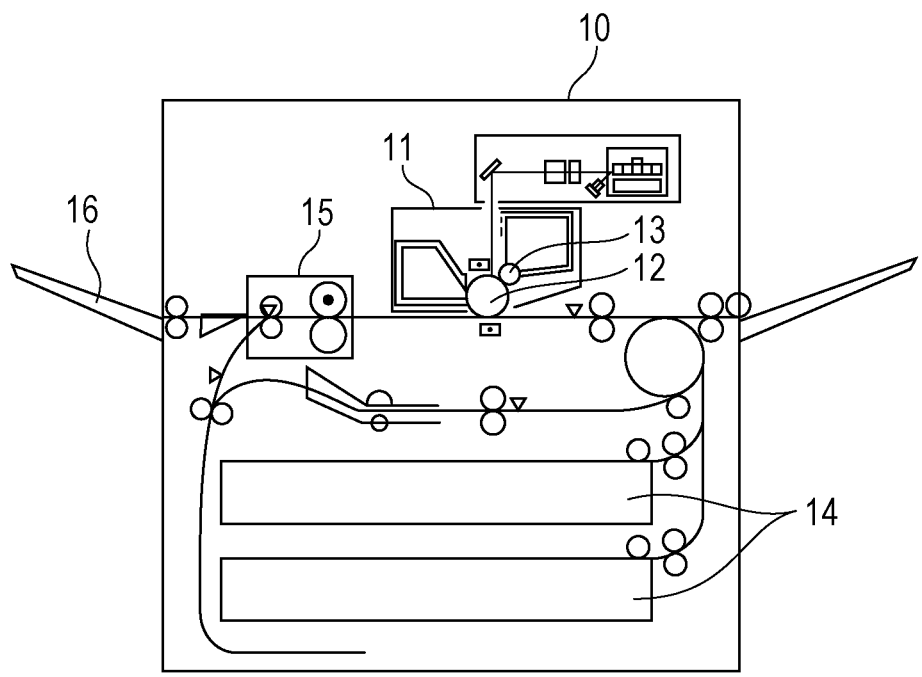
FIGS. 10A and 10B are diagrams illustrating examples of applications of a switching power supply.
Figure 10B:
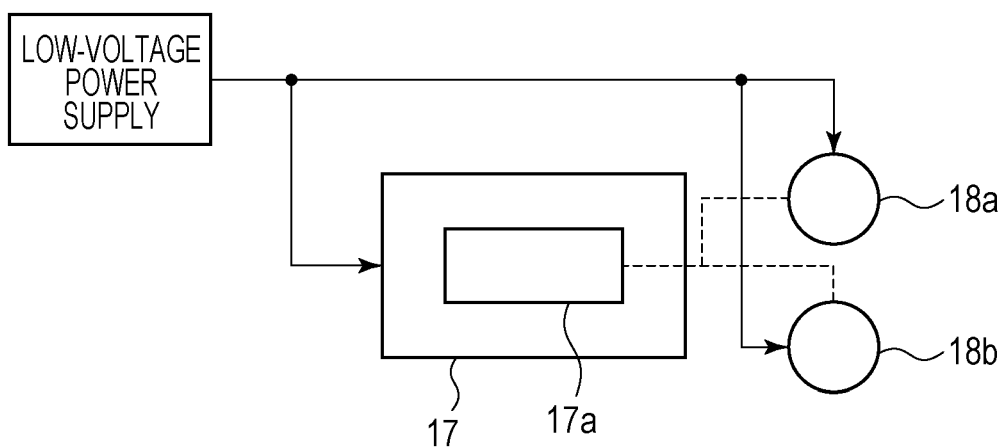

FIG. 10A illustrates a structure of a laser beam printer which is an example of an image forming apparatus. The laser beam printer 10 includes a photosensitive drum 12 which is located in an image forming unit 11 and which serves as an image bearing member on which a latent image is formed, and a developing unit 13 configured to develop the latent image formed on the photosensitive drum with toner. The toner image developed on the photosensitive drum 12 is transferred to a sheet (not shown) serving as a storage medium fed from a cassette 14. After the toner image transferred to the sheet is fixed by a fixing unit 15, the sheet is discharged onto a tray 16. FIG. 10B illustrates an electric power supply line via which to supply electric power to a controller 17 serving as a control unit of the image forming apparatus and motors 18a and 18b serving as driving units of the image forming apparatus. The current resonance power supply described above may be used as a low voltage power supply for supplying electric power to the controller 17 including a CPU 17a that controls the operation of the image forming apparatus and also supplying electric power to the motors 18a and 18b serving as driving units of the image forming apparatus. More specifically, for example, 3.3 V is supplied to the controller 17 and 24 V is supplied to the motors 18a and 18b. For example, the motor 18a is for driving a conveying roller to convey the sheet, and the motor 18b is for driving the fixing unit 15. Also in a case where the power supply using the synchronous rectification circuit described above is used as the low voltage power supply of the image forming apparatus, a switching device (synchronous rectification FET) with a low on-resistance may be used to realize the switching power supply of the synchronous rectification type capable of operating correctly with a high efficiency.

The power supply according to any embodiment described above may be used in a wide variety of apparatuses in addition to the image forming apparatus.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-240585 filed Nov. 1, 2011, which is hereby incorporated by reference herein in its entirety.

What is claimed is:

1. A power supply comprising:
a transformer including a primary winding and a secondary winding;
a switching element connected to the secondary winding of the transformer and configured to perform a switch according to a voltage generated in the secondary winding of the transformer;
a first current-voltage conversion unit configured to convert a current on a secondary winding connected-side of the switching element to a first voltage;
a second current-voltage conversion unit configured to convert a current on a voltage-output side of the switching element to a second voltage;
a comparator configured to compare the first voltage and the second voltage;
a switching off unit configured to turn off the switching element in response to a signal from the comparator; and
a state holding unit configured to hold an off state of the switching element and connected to the voltage-output side of the switching element and the switching off unit.

2. The power supply according to claim 1, wherein in response to rising of the voltage on the secondary winding connected-side of the switching element, the switching element is released from the off state held by the state holding unit.

3. The power supply according to claim 1,
wherein each of the first and second current-voltage conversion units includes a constant current circuit.

4. The power supply according to claim 1, further comprising a capacitor connected to the secondary winding of the transformer configured to rectify and smooth the voltage generated at the secondary winding while the switching element is turned on.

5. An image forming apparatus comprising:
an image forming unit configured to form an image on a recording material;
a control unit configured to control an operation of the image forming unit; and
a power supply configured to supply a DC voltage to the control unit,
the power supply including
a transformer provided with a primary winding and a secondary winding;
a switching element connected to the secondary winding of the transformer and configured to perform a switch according to a voltage generated in the secondary winding of the transformer;
a first current-voltage conversion unit configured to convert a current on a secondary winding connected-side of the switching element to a first voltage;
a second current-voltage conversion unit configured to convert a current on a voltage-output side of the switching element to a second voltage;
a comparator configured to compare the first voltage and the second voltage;
a switching off unit configured to turn off the switching element in response to a signal from the comparator, and
a state holding unit configured to hold an off state of the switching element and connected to the voltage-output side of the switching element and the switching off unit.

6. The image forming apparatus according to claim 5, in response to rising of the voltage on the secondary winding connected-side of the switching element, the switching element is released from the off state held by the state holding unit.

7. The image forming apparatus according to claim 5,
wherein each of the first and second current-voltage conversion units includes a constant current circuit.

8. The image forming apparatus according to claim 5, further comprising a capacitor connected to the secondary winding of the transformer configured to rectify and smooth the voltage generated at the secondary winding while the switching element is turned on.

9. The power supply according to claim 1, wherein the power supply is provided with the primary-side switching element connected to the primary winding of the transformer, and
wherein the primary-side switching element and the switching element alternately turn on.

10. The power supply according to claim 1, wherein the switching off unit comprises a first switch which is turned off in response to the signal from the comparator, and a second switch connected to the first switch configured to hold an off-state of the first switch.

11. The image forming apparatus according to claim 5, wherein the image forming apparatus is provided with the primary-side switching element connected to the primary winding of the transformer, and wherein the primary-side switching element and the switching element alternately turn on.

12. The image forming apparatus according to claim 5, wherein the switching off unit comprises a first switch which is turned off in response to the signal from the comparator, and a second switch connected to the first switch configured to hold an off-state of the first switch.

* * * * *